(12) United States Patent
Nihei

(10) Patent No.: US 8,884,347 B2
(45) Date of Patent: Nov. 11, 2014

(54) PHOTOELECTRIC CONVERSION DEVICE, PACKAGE STRUCTURE THEREFOR, AND METHOD OF MANUFACTURING PHOTOELECTRIC CONVERSION DEVICE

(75) Inventor: Yasuhide Nihei, Kanagawa (JP)

(73) Assignee: Sony Corporation (JP)

( * ) Notice: Subject to any disclaimer, the term of this patent is extended or adjusted under 35 U.S.C. 154(b) by 499 days.

(21) Appl. No.: 13/159,066

(22) Filed: Jun. 13, 2011

(65) Prior Publication Data

US 2011/0316108 A1    Dec. 29, 2011

(30) Foreign Application Priority Data

Jun. 28, 2010   (JP) .................. 2010-146028

(51) Int. Cl.
*H01L 21/02*        (2006.01)
*H01L 27/146*       (2006.01)
*H01L 31/062*       (2012.01)

(52) U.S. Cl.
CPC .... *H01L 27/14618* (2013.01); *H01L 27/14683* (2013.01); *H01L 27/14623* (2013.01)
USPC .... 257/294; 257/435; 257/281; 257/E27.133; 257/E21.499; 257/E31.127; 438/69; 438/73; 438/113; 438/401; 348/294; 348/335; 348/340

(58) Field of Classification Search
CPC ............ H01L 27/146; H01L 27/14612; H01L 27/14618; H01L 27/14621; H01L 27/14623; H01L 27/14625; H01L 27/14627; H01L 27/14635; H01L 27/14645; H01L 27/14683; H01L 27/14685; H01L 27/14689; H01L 27/3269; H01L 21/56; H01L 21/02162; H01L 21/02164; H01L 31/02; H01L 31/02162; H01L 31/0232; H01L 31/18; H01L 31/0203; H01L 31/0352; H01L 31/14641; H04N 3/155; H04N 3/14; H04N 5/335; H04N 5/374
USPC ............ 257/294, 281, 435, 432, 59, 72, 440, 257/797, 690, E27.131, E27.133, E27.13, 257/E27.134, E27.135, E27.138, E27.142, 257/E27.15, E21.54, E21.499, E21.502, 257/E23.179, E31.097, E31.11, E31.117, 257/E31.127; 438/69, 73, 65, 113, 401; 348/294, 335, 340, 302, 308, E3.018, 348/E5.001, E5.028

See application file for complete search history.

(56) References Cited

U.S. PATENT DOCUMENTS

2010/0073531 A1*  3/2010  Yano et al. ............... 348/294
2010/0283113 A1*  11/2010 Kang et al. ............... 257/432

* cited by examiner

*Primary Examiner* — W. Wendy Kuo
*Assistant Examiner* — Moazzam Hossain
(74) *Attorney, Agent, or Firm* — Sheridan Ross P.C.

(57) ABSTRACT

The present disclosure provides a method of manufacturing a photoelectric conversion device, including, a first step of forming a plurality of photoelectric conversion regions on a surface on one side of a semiconductor wafer, a second step of preparing a light-blocking wafer having insertion openings, a third step of bonding the one-side surface of the semiconductor wafer and a surface on the opposite side to a surface on the one side of the light-blocking wafer to each other to form a bonded wafer body, and a fourth step of dividing the bonded wafer body in peripheries of the photoelectric conversion regions, to obtain bonded-body chips each having the photoelectric conversion region.

15 Claims, 11 Drawing Sheets

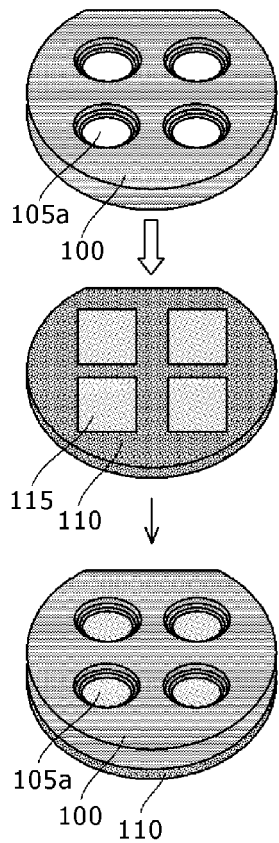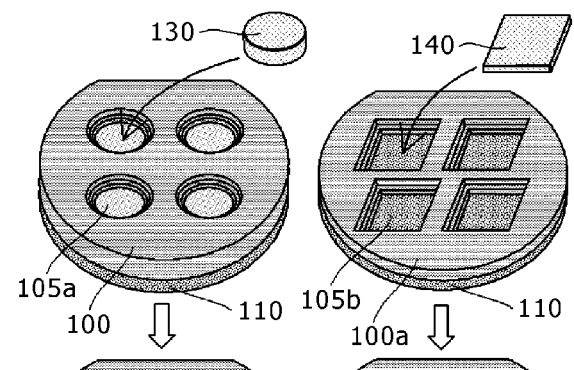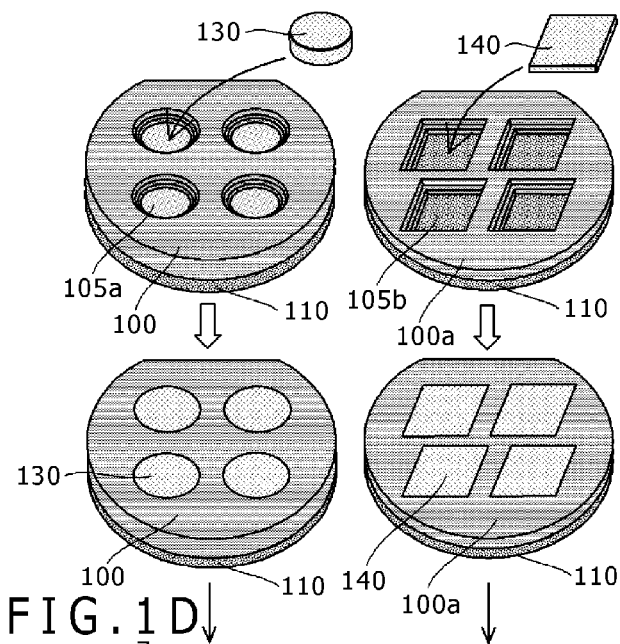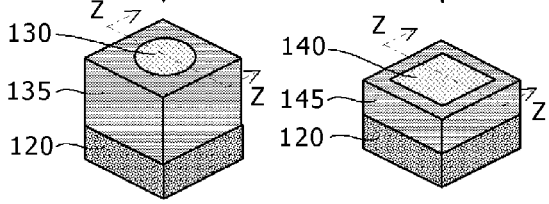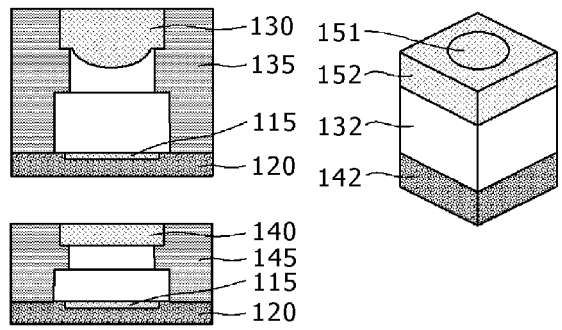

FIG.3A FIG.3B
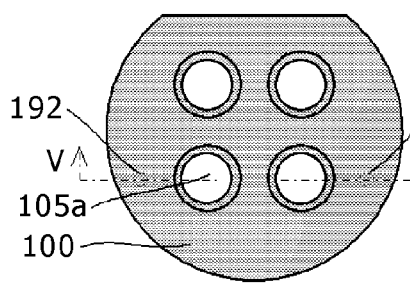
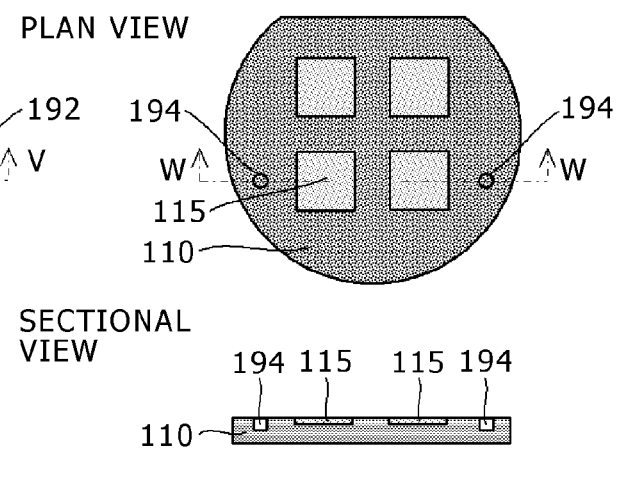
FIG.3C
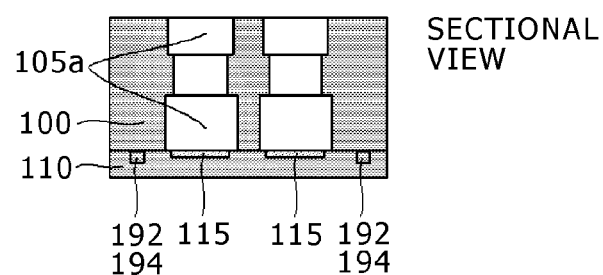

FIG.5A
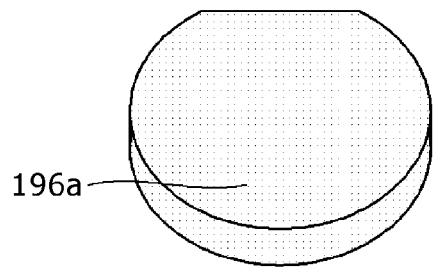
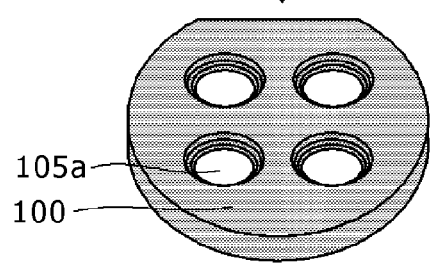
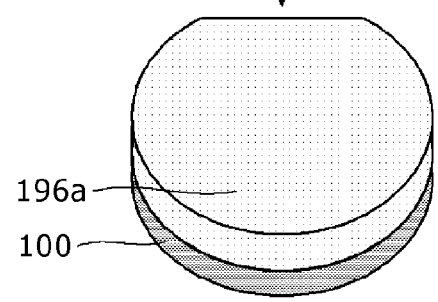
FIG.5B
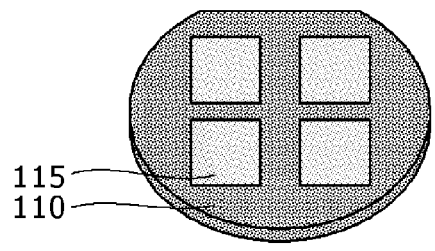
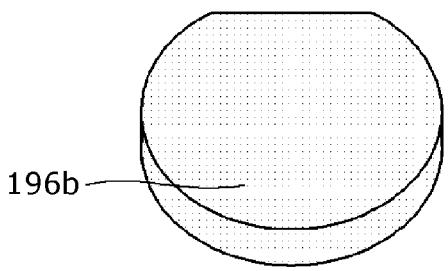
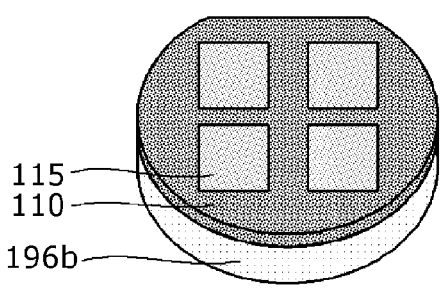
FIG.5C
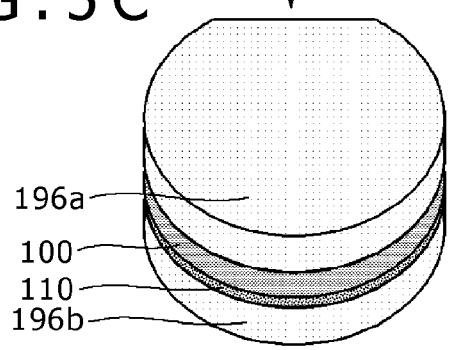

FIG.7A
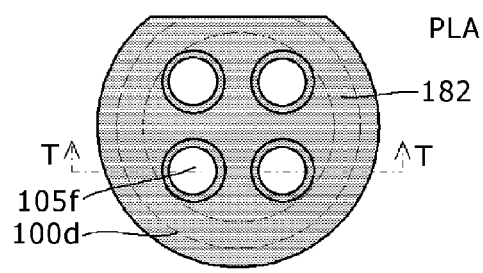
FIG.7B
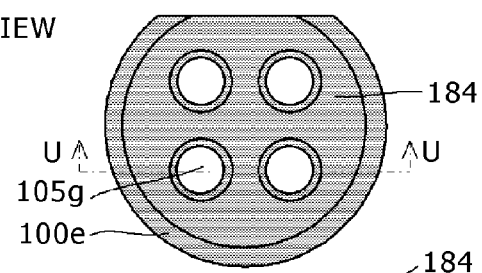
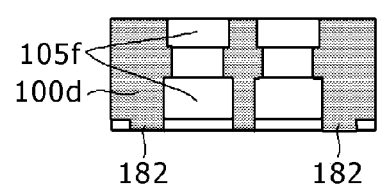
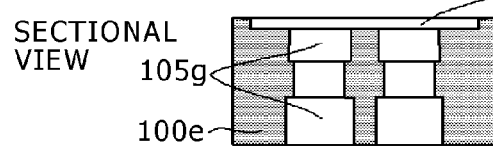
FIG.7C
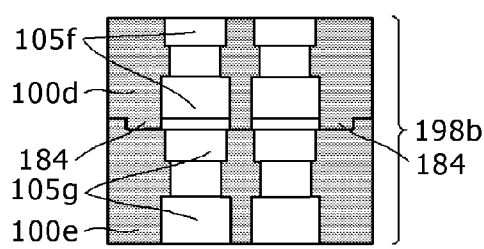

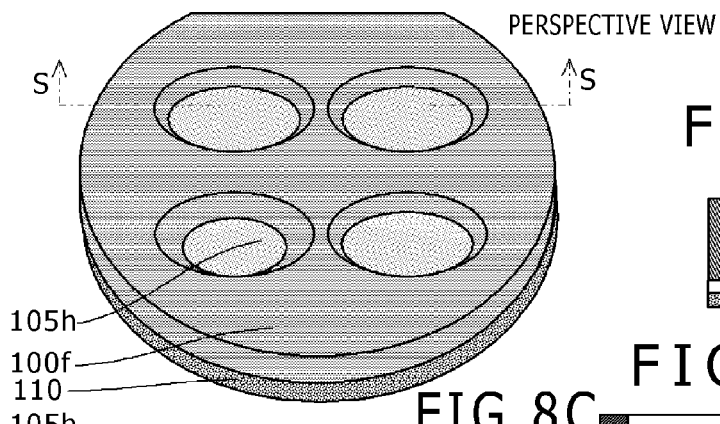
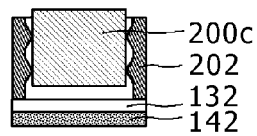
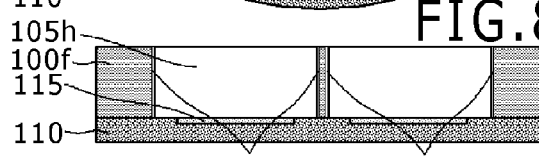
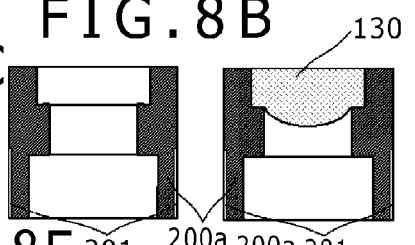
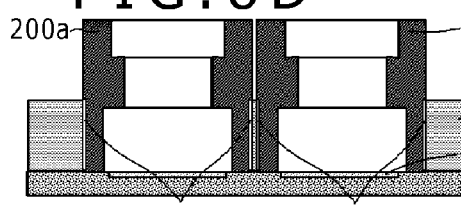
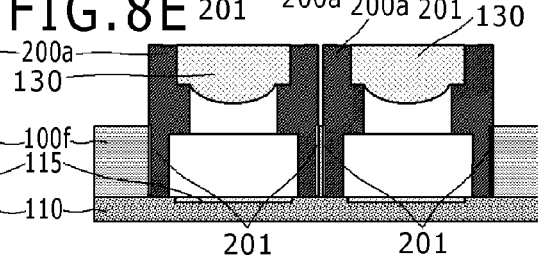
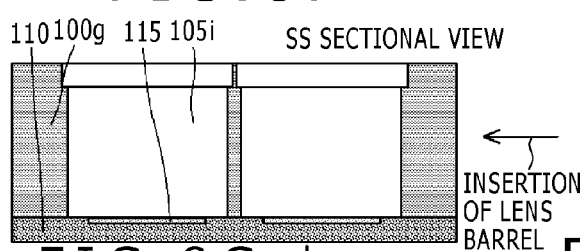
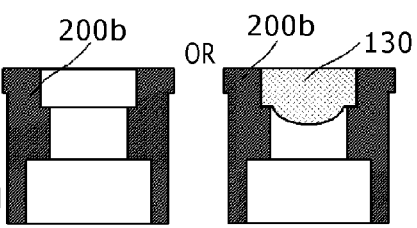
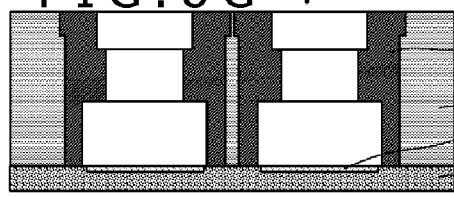
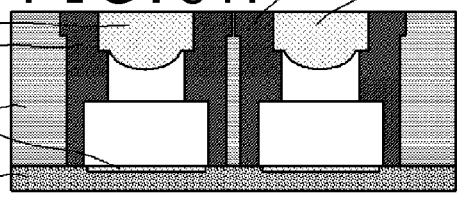

PRIOR ART

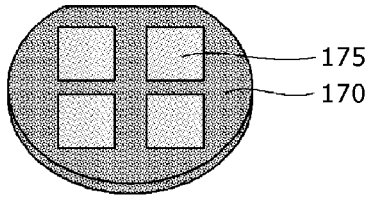
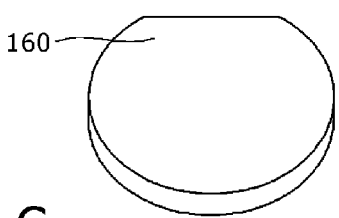
FIG.11C (RELATED ART)
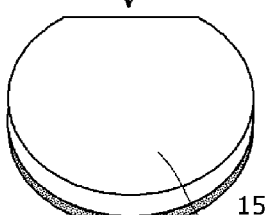 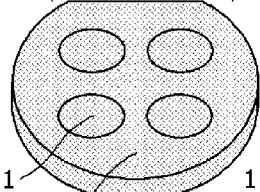 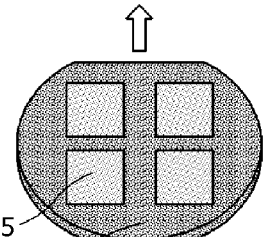
FIG.11B (RELATED ART)
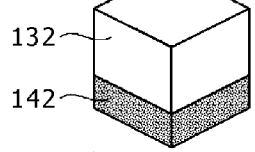 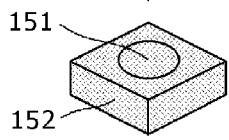 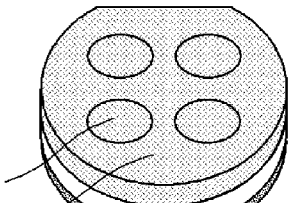

FIG.11F (RELATED ART) → FIG.11G (RELATED ART) 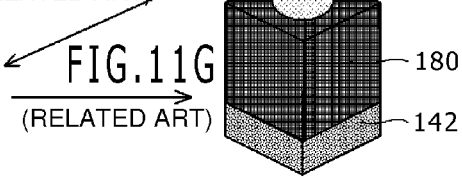

PHOTOELECTRIC CONVERSION DEVICE, PACKAGE STRUCTURE THEREFOR, AND METHOD OF MANUFACTURING PHOTOELECTRIC CONVERSION DEVICE

BACKGROUND

The present technology relates to a photoelectric conversion device, a package structure therefor, and a method of manufacturing a photoelectric conversion device wherein a simple structure and an excellent light blocking-property are ensured and reductions in size (tallness, thickness) and cost can be realized.

Mobile apparatuses such as cell phones, PDAs (personal digital assistance), notebook type computers, etc. on which a small-sized camera module including an optical part such as a lens, etc. and a solid state imaging element is mounted have come to be used widely. With respect to the camera modules mounted on these mobile apparatuses, further reductions in size (tallness, thickness) and in cost are being demanded.

Normally, the camera module includes an image sensor chip formed with a solid state imaging element such as CCD (Charge Coupled Device), CMOS (Complementary Metal-Oxide Semiconductor), etc. and an imaging lens (optical lens) for forming a subject image on a light-receiving surface of the image sensor chip.

In order to reduce the size and weight of the image sensor package, there is used, for example, the wafer level chip size package (W-CSP) system in which the image sensor chip is packaged on a wafer level. A wafer formed with a multiplicity of image sensor chips is called, for example, a sensor wafer.

The imaging lens can be produced, for example, as a wafer scale lens including a single or plural substrates. The wafer scale lens has a single substrate (wafer) formed with a multiplicity of lenses (lens elements) or has a plurality of such substrates stacked on one another. The wafer scale lens is formed with a plurality of imaging lenses each having a single or plural lenses.

The sensor wafer formed with a multiplicity of image sensor chips and the wafer scale lens are bonded to each other, and the bonded body is then divided, to obtain modules (wafer scale camera modules) each including the image sensor chip and the imaging lens.

Heretofore, a large number of reports have been made on the structure and manufacturing method of camera modules (see, for example, nine patent documents and a non-patent document as follows:

Patent Documents
1. Japanese Patent Laid-open No. 2002-290842 (paragraph 0011, FIGS. 1 to 3)
2. Japanese Patent Laid-open No. 2006-228837 (paragraph 0013, FIG. 1)
3. Japanese Patent Laid-open No. 2008-508545 (paragraphs 0021 to 0022, paragraphs 0031 to 0042, FIGS. 1 to 5)
4. Japanese Patent Laid-open No. 2008-512851 (claim 18, FIGS. 3 to 6)
5. JP-T-2009-512346 (paragraphs 0008 to 0010, FIG. 18)
6. Japanese Patent Laid-open No. 2010-2921 (paragraphs 0048 to 0060, FIG. 12)
7. Japanese Patent Laid-open No. 2010-45162 (claim 5, paragraphs 0048 to 0057, FIG. 4)
8. Japanese Patent Laid-open No. 2010-45650 (paragraphs 0009 to 0028, FIGS. 1 to 3)
9. Japanese Patent Laid-open No. 2010-11230 (paragraphs 0018 to 0021, paragraphs 0033 to 0039, FIGS. 1 and 3) herein after referred to as Patent Document 9

Non-Patent Document
1. TESSERA, "Wafer-Level Optics," [Searched Mar. 3, 2010], Internet<http://www.tessera.com/technologies/imagingandoptics/Pages).

Patent Document 9 titled "Camera Module" contains the following description.

FIG. 10 in the present disclosure, which is FIG. 3 in Patent Document 9, is a sectional view showing schematically the structure of a camera module according to related art. This camera module is composed mainly of a solid state imaging device 330 and a lens unit 320 including optical lenses. The solid state imaging device 330 is an image sensor of the wafer level chip size package structure, which is provided therein with penetrating electrodes 305 and solder balls 306, and in which a transparent plate-like member 304 is provided on a chip having an imaging area 308 formed at a surface of a semiconductor substrate 310. In addition, a multiplicity of microlenses (not shown) are formed in the imaging area 308, and each of the microlenses is formed with a light reception element. Lens elements 303 play the role of forming an image in the imaging area 308 of the solid state imaging device 330.

The solid state imaging device 310 and the lens unit 320 are respectively produced in separate steps, before being adhered to each other to complete the camera module. The transparent plate-like member 304 is bridgingly supported over the imaging area 308 by ribs 311 surrounding the imaging area 308, and a void is formed between the transparent plate-like member 304 and the imaging area 308. The void is filled up with air, to form a transparent layer 309. The ribs 311 are parts where scribe lines for dividing the adhered body into individual imaging element chips after formation of the imaging element chips are provided. The transparent plate-like member 304 includes a glass plate or the like, functions mainly to protect the imaging area 308 and to mount and fix thereon the lens unit 320 provided over the solid state imaging device 310, and has an infrared (IR) cut filter 307 formed with a laminate film on a surface thereof.

The lens unit 320 includes spacers 312 and wafer level lens substrate glasses 313 each provided with a lens element 303 in the center thereof. The wafer level lens substrate glasses 313 are transparent glass wafers having the same size as that of the semiconductor substrate in a wafer state before division into individual solid state imaging devices, and are stacked together through the spacer 312 surrounding the four sides of the imaging area 308. Specifically, the lens elements 303 are each supported by the spacer 312 and the other portion of the wafer level lens substrate glass 313 than the lens element portion; thus, the spacer 312 and the just-mentioned other portion are substantially realizing the function of a lens support.

The material of the spacers 312 is a resin or the like, which is not particularly limited; preferably, the spacers 312 as well as the ribs 11 are formed from a light-blocking material. A vapor-deposited metal film 301 shielding electromagnetic waves mainly is formed on the whole part of side surfaces on the four sides of the camera module, and the vapor-deposited metal film 301 is grounded through the solder balls 306 and the like. It is described that since the vapor-deposited metal film 301 functions also as a light-blocking film, covering the periphery of the lens support makes it possible to enhance the optical performance of the camera module as a whole. These are the contents of the description in Patent Document 9.

Incidentally, an example of the method of manufacturing a camera module by the wafer level chip size package (WLCSP) process in related art will be briefly described as follows.

FIGS. 11A to 11G illustrate methods of manufacturing a camera module and the configuration of the camera module according to the related art.

Examples of the method of manufacturing a camera module by the WLCSP process include a first method shown in FIGS. 11A to 11D and a second method shown in FIG. 11E to 11F. Incidentally, in the following description, it is assumed that a semiconductor wafer 170 having a plurality of image sensor regions 175 each formed with a multiplicity of imaging elements and a lens wafer formed with a plurality of lenses 151 have already been prepared.

The process of manufacturing a camera module by the first method will be outlined as follows. As shown in FIG. 11A, a transparent wafer 160 is bonded to a surface, on the side on which the image sensor regions 175 are formed, of the semiconductor wafer 170 for protecting the image sensor regions 175 of the semiconductor wafer 170 and for supporting the semiconductor wafer 170. The transparent wafer 160 is, for example, a glass substrate.

As shown in FIG. 11B and FIG. 11C, the bonded body, having the transparent wafer 160 and the semiconductor wafer 170, and the lens wafer 150 are respectively diced into individual pieces, whereby bonded-body chips having a structure in which the glass chip 132 and the semiconductor chip 142 are bonded to each other, and the lens chips 152, are produced. Then, as shown in FIG. 11D, the camera modules each having the bonded-body chip and the lens chip 152 bonded to each other are produced.

The process of manufacturing a camera module by the second method will be outlined as follows. As shown in FIG. 11E, the side, on which image sensor regions 175 are formed, of a semiconductor wafer 170 is bonded to a surface on one side of a transparent wafer 160. Further, a lens wafer 150 is bonded to a surface on the other side of the transparent wafer 160. Thus, the semiconductor wafer 170 is bonded to the one-side surface of the transparent wafer 160, and the lens wafer 150 is bonded to the other-side surface of the transparent wafer 160. As a result, a camera module in a wafer state (WLCM: wafer level camera module) is formed.

Next, as shown in FIG. 11F, the WLCM is diced into individual chips, to produce camera modules having a structure in which the lens chip 152, the glass chip 132 and the semiconductor chip 142 are stacked on and bonded to one another.

As shown in FIG. 11G, the camera module shown in FIG. 11D is subjected to a light-blocking treatment, whereby a layer (film) for blocking transmission of light is formed on the surfaces of the lens chip 152 exclusive of an effective lens surface and on the surfaces of the glass chip 132.

SUMMARY

For the purpose of realizing a camera module wherein further reductions in size (tallness, thickness) and cost are possible, the methods of manufacturing a camera module according to related art based on the WLCSP process have the following problems.

In the first method shown in FIGS. 11A to 11D, the bonded body, having the transparent wafer 160 and the semiconductor wafer 170, and the lens wafer 150 are respectively diced into individual pieces, and thereafter bonding between each of the bonded-body chips and each of the lens chips 152 is performed to produce the camera modules. Therefore, when bonding between each non-defective bonded-body chip and each non-defective lens chip 152 is performed in the bonding, it is possible to lessen the yield loss. This method, however, is disadvantageous in that a troublesome work of bonding tiny chips (the bonded-body chip and the lens chip 152) to each other is included in the method and that the number of steps is large.

In the second method shown in FIGS. 11E to 11F, the bonded body (the wafer level camera module (WLCM)) of the lens wafer 150, the transparent wafer 160 and the semiconductor wafer 170 is diced into individual pieces, to produce the camera modules. This method, therefore, is disadvantageous in that the yield is lowered in the case where lenses 151 formed in defective state or/and image sensor regions 175 formed in defective state are included.

The transparent plate-like member 304 shown in FIG. 10 and the glass chip 132 shown in FIGS. 11A to 11G, which are included in the camera module according to the related art, do not have any optical action of changing the optical path of light and, hence, are optically unnecessary members. In addition, the glass chip 132 is poor in light-blocking property. Accordingly, there would be a need for a light-blocking treatment process as shown in FIG. 11G.

In the WLCSP process, the transparent wafer 160 in FIGS. 11A to 11G is an indispensable member for supporting the semiconductor wafer to be formed with the image sensor regions and for protecting the image sensor regions. The glass chip 132 derived from the transparent wafer 160, however, is an optically unnecessary member, as above-mentioned, and is a member which would hinder a further reduction in size (tallness, thickness) of the camera module.

Thus, it is desirable to provide a photoelectric conversion device, a package structure therefor, and a method of manufacturing a photoelectric conversion device wherein a simple structure and an excellent light-blocking property are ensured and reductions in size (tallness, thickness) and cost can be realized.

According to one embodiment of the present technology, there is provided a method of manufacturing a photoelectric conversion device, including: a first step of forming a plurality of photoelectric conversion regions (for example, image sensor regions 115 in embodiments described later) on a surface on one side of a semiconductor wafer; a second step of preparing a light-blocking wafer (for example, a black wafer 100 in the embodiments described later) having insertion openings each formed so that an optical element (for example, a lens 130 in the embodiments described later) is inserted therein from at least one side, the insertion openings corresponding respectively to the photoelectric conversion regions; a third step of bonding the one-side surface of the semiconductor wafer and a surface on the opposite side to a surface on the one side of the light-blocking wafer to each other, in such a manner that the photoelectric conversion regions and the insertion openings correspond to each other, to form a bonded wafer body; and a fourth step of dividing the bonded wafer body in peripheries of the photoelectric conversion regions, to obtain bonded-body chips (for example, camera modules in the embodiments described later) each having the photoelectric conversion region.

According to another embodiment of the present technology, there is provided a package structure for a photoelectric conversion device, wherein in regard to a semiconductor wafer having a plurality of photoelectric conversion regions (for example, the image sensor regions 115 in the embodiments described later) formed on a surface on one side thereof and a light-blocking wafer (for example, the black wafer 100 in the embodiments described later) having insertion openings each formed so that an optical element (for example, the lens 130 in the embodiments described later) is inserted therein from at least one side, the insertion openings corresponding respectively to the photoelectric conversion regions, the one-side surface of the semiconductor wafer and a surface on the opposite side to the one side of the light-blocking wafer are bonded to each other to form a bonded wafer body, the bonded wafer body is divided in peripheries of the photoelectric conversion regions to form bonded-body chips (for example, the camera modules in the embodiments described later) each having the photoelectric conversion region, and the photoelectric conversion regions and the insertion openings correspond to each other.

According to a further embodiment of the present technology, there is provided a photoelectric conversion device having the above-mentioned package structure for the photoelectric conversion device.

In accordance with the one embodiment of the present technology, a method of manufacturing a photoelectric conversion device includes: a first step of forming a plurality of photoelectric conversion regions on a surface on one side of a semiconductor wafer; a second step of preparing a light-blocking wafer having insertion openings each formed so that an optical element is inserted therein from at least one side, the insertion openings corresponding respectively to the photoelectric conversion regions; a third step of bonding the one-side surface of the semiconductor wafer and a surface on the opposite side to a surface on the one side of the light-blocking wafer to each other, in such a manner that the photoelectric conversion regions and the insertion openings correspond to each other, to form a bonded wafer body; and a fourth step of dividing the bonded wafer body in peripheries of the photoelectric conversion regions, to obtain bonded-body chips each having the photoelectric conversion region. Therefore, by utilizing the wafer level chip size packaging (WLCSP) process, it is possible to provide a method of manufacturing a photoelectric conversion device wherein a simple structure and an excellent light-blocking property are ensured and reductions in size (tallness, thickness) and cost can be realized.

Besides, in accordance with the another embodiment of the present technology, in regard to a semiconductor wafer having a plurality of photoelectric conversion regions formed on a surface on one side thereof and a light-blocking wafer having insertion openings each formed so that an optical element is inserted therein from at least one side, the insertion openings corresponding respectively to the photoelectric conversion regions, the one-side surface of the semiconductor wafer and a surface on the opposite side to the one side of the light-blocking wafer are bonded to each other to form a bonded wafer body, the bonded wafer body is divided in peripheries of the photoelectric conversion regions to form bonded-body chips each having the photoelectric conversion region, and the photoelectric conversion regions and the insertion openings correspond to each other. Therefore, by utilizing the wafer level chip size packaging (WLCSP) process, it is possible to provide a package structure for a photoelectric conversion device wherein a simple structure and an excellent light-blocking property are ensured and reductions in size (tallness, thickness) and cost can be realized.

Further, in accordance with the further embodiment of the present technology, a photoelectric conversion device has the above-mentioned package structure for the photoelectric conversion device. Therefore, it is possible to provide a photoelectric conversion device wherein a simple structure and an excellent light-blocking property are ensured and reductions in size (tallness, thickness) and cost can be realized.

BRIEF DESCRIPTION OF THE DRAWINGS

FIGS. 1A to 1F illustrate methods of manufacturing a camera module and configurations of the camera modules, in embodiments of the present technology, with FIG. 1G illustrating the configuration of a camera module according to related art;

FIGS. 3A to 3C illustrate alignment between the black wafer and the semiconductor wafer, in an embodiment of the present technology;

FIGS. 5A to 5C illustrate bonding between a black wafer and a semiconductor wafer by use of wafer reinforcement plates, in an embodiment of the present technology;

FIGS. 7A to 7C illustrate alignment in forming the stack obtained by bonding a plurality of black wafers, in an embodiment of the present technology;

FIGS. 8A to 8H illustrate fixation of lens barrels to a black wafer, in embodiments of the present technology, with FIG. 8I illustrating an example of fixation of a lens barrel in a camera module according to related art;

FIGS. 11A to 11G illustrate a method of manufacturing a camera module and the configuration of the camera module, according to related art.

DETAILED DESCRIPTION OF THE PREFERRED EMBODIMENTS

Figure 2A:
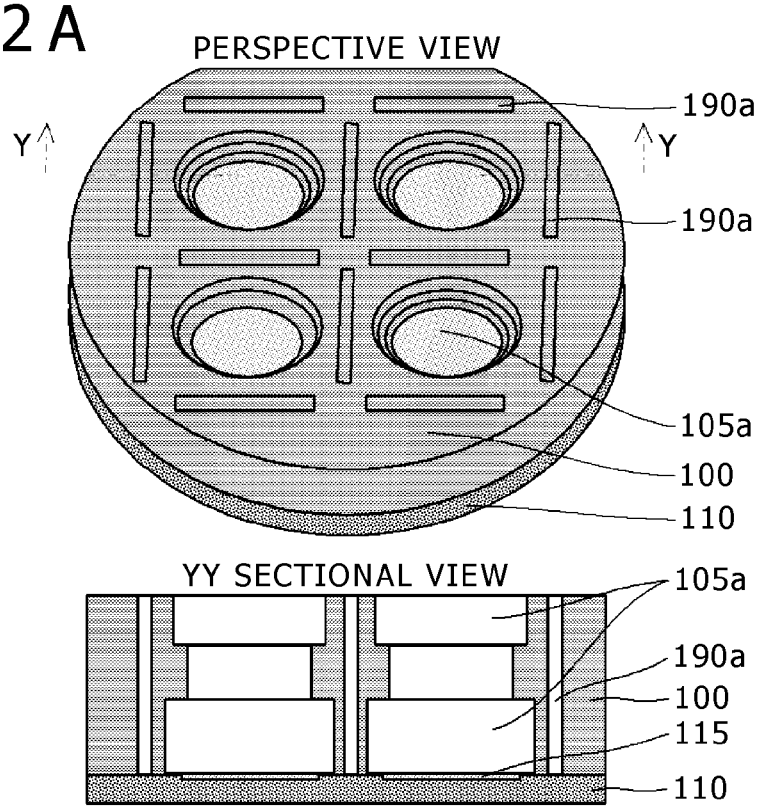
FIGS. 2A to 2B illustrate bonding between a black wafer and a semiconductor wafer by use of a photoirradiation-type resin, in an embodiment of the present technology.

In the method of manufacturing the photoelectric conversion device according to the one embodiment of the present technology, preferably, the light-blocking wafer is a wafer formed from carbon or resin. This configuration ensures that, since the wafer itself has a light-blocking property, it is possible, by providing the wafer itself with a function of holding the optical element, to provide a method of manufacturing a photoelectric conversion device such that simplification of the manufacturing method can be realized.

In addition, preferably, the light-blocking wafer is a wafer obtained by stacking and bonding a plurality of unit wafers each formed with the insertion openings and formed from carbon or resin, and a step of inserting the optical elements into the insertion openings is provided prior to the third step. This configuration makes it possible to provide a method of manufacturing a photoelectric conversion device such that the optical elements are held by the unit wafers, and that it is easy to configure a high-performance optical system including a multiplicity of the optical elements.

Besides, preferably, a step of bonding a reinforcement plate to a surface on the opposite side to the one-side surface of the semiconductor wafer or/and to the one-side surface of the light-blocking wafer is provided prior to the third step. This configuration makes it possible to provide a method of manufacturing a photoelectric conversion device attended by the following effects. Due to the bonding of the reinforcement plate(s), even in the case where the semiconductor wafer or/and the light-blocking wafer are small in thickness and are susceptible to mechanical deformation, the semiconductor wafer or/and the light-blocking wafer are protected from external forces, in the third step, so that the possibility of such problems as warping of the semiconductor wafer or/and the light-blocking wafer is lowered. In addition, by peeling the reinforcement plate(s) after the third step and before the fourth step, the reinforcement plate(s) can be reused. Therefore, productivity can be enhanced, without causing an increase in production cost.

Besides, preferably, that part of the light-blocking wafer at which the bonded wafer body is divided in the fourth step and which is adjacent to the insertion opening of the light-blocking wafer is formed, in the second step, with a hole penetrating the light-blocking wafer. This configuration makes it possible to provide a method of manufacturing a photoelectric conversion device accompanied by the following advantages. The UV (Ultraviolet) radiation for curing a photo- and thermo-setting adhesive used for bonding between the semiconductor wafer and the light-blocking wafer can be radiated to the bonding area between the semiconductor wafer and the light-blocking wafer via the hole(s) penetrating the light-blocking wafer. Therefore, a better curing effect can be obtained. In addition, when the cutting and dividing of the bonded wafer body in the fourth step is conducted along a line passing through the part where the hole(s) penetrating the light-blocking wafer is formed, the time required for the cutting can be shortened.

In addition, preferably, alignment between the semiconductor wafer and the light-blocking wafer is performed in the third step so that the photoelectric conversion regions of the semiconductor wafer and the insertion openings of the light-blocking wafer correspond to each other. This configuration ensures that the semiconductor wafer and the light-blocking wafer are aligned with each other in such a manner that the center positions of the insertion openings and the center positions of the photoelectric conversion regions correspond to each other accurately. Consequently, it is possible to provide a method of manufacturing a photoelectric conversion device wherein the optical axis of the photoelectric conversion device can be accurately set.

Besides, preferably, the one-side surface of the semiconductor wafer and the opposite-side surface of the light-blocking wafer are formed respectively with fitting sections for fitting between the semiconductor wafer and the light-blocking wafer, and the semiconductor wafer and the light-blocking wafer are fitted to each other in the third step. This configuration ensures that the semiconductor wafer and the light-blocking wafer are aligned with each other through the fitting sections in such a manner that the center positions of the insertion openings and the center position of the photoelectric conversion regions correspond to each other accurately. Accordingly, it is possible to provide a method of manufacturing a photoelectric conversion device such that the optical axis of the photoelectric conversion device can be set accurately.

In addition, preferably, a step of inserting the optical elements into the insertion openings is provided before or after the fourth step. This configuration makes it possible to provide a method of manufacturing a photoelectric conversion device attended by the following advantages. In the case where the light-blocking wafer is a single unit wafer, it suffices that the optical elements are inserted into the insertion openings, either before or after the fourth step. In the case where the light-blocking wafer has a plurality of the unit wafers stacked on and bonded to one another, on the other hand, it suffices for the optical elements to be inserted into the insertion openings of the unit wafer stacked as the second or latter layer, from at least one side of the light-blocking wafer, prior to the third step. Therefore, irrespective of whether the number of the unit wafer(s) which may be stacked is single or plural, the optical elements can be inserted into the insertion openings. Besides, the number of the optical element(s) is arbitrary. In addition, the timing of arrangement into the photoelectric conversion device has a degree of freedom.

Besides, preferably, prior to the step of inserting the optical elements, the optical elements are each provided with an aperture member which includes a light-transmitting aperture section permitting transmission of light therethrough and a light transmission restricting section restricting transmission of light through other region than the light-transmitting aperture section. This configuration makes it possible to provide a method of manufacturing a photoelectric conversion device wherein the aperture member may be formed by: a printed part and a non-printed part which are formed at the light transmission restricting section on a surface of the optical element using a coating material containing a black material; a film-formed part and a non-film-formed part which are formed at the light transmission restricting section on a surface of the optical element by vapor deposition of a black material; a black sheet having an aperture section which is provided in contact with the optical element, has the same area as that of the optical element, and penetrates as a light-transmitting aperture section; a black plate having an aperture section which is provided in an optical path where the optical element is disposed and which penetrates as a light-transmitting aperture section; or the like, and wherein the aperture member can be made to be an optical aperture.

In addition, preferably, a step of inserting the optical elements into the insertion openings is provided prior to the fourth step, a light-blocking sheet is bonded to a surface on the one side of the light-blocking wafer after the insertion of the optical elements into the insertion openings, and the light-blocking sheet is an optical sheet which defines light transmission regions, the optical sheet including light-transmitting aperture sections which are formed correspondingly to the insertion openings of the light-blocking wafer and permit transmission of light therethrough, and a light transmission restricting section which restricts transmission of light through other region than the light-transmitting aperture sections. This configuration makes it possible to provide a method of manufacturing a photoelectric conversion device accompanied by the following effects. Since the optical sheet is bonded to the one-side surface of the light-blocking wafer after the insertion of the optical elements into the insertion openings, the optical sheet is also divided by and simultaneously with the dividing of the bonded wafer body in the fourth step. As a result, it is possible to produce the bonded-body chips each having the divided optical sheet as an optical aperture. Thus, the optical aperture can be formed by the wafer level chip size packaging (WLCSP) process.

Besides, preferably, a step of inserting optical barrels each having the optical element held thereon into the insertion openings is provided before or after the fourth step. According to this configuration, it is possible to provide a method of manufacturing a photoelectric conversion device wherein the number of the optical element(s) is arbitrary, since an arbitrary number of the optical element(s) are held on the optical barrel. Further, it is possible to provide a method of manufacturing a photoelectric conversion device wherein the timing of arrangement of the optical element(s) into the photoelectric conversion device has a degree of freedom.

In addition, preferably, prior to the step of inserting the optical barrels into the insertion openings, the optical elements held in the optical barrels are each provided with an aperture member including a light-transmitting aperture section which permits transmission of light therethrough, and a light transmission restricting section which restricts transmission of light through other region than the light-transmitting aperture section. This configuration makes it possible to provide a method of manufacturing a photoelectric conversion device wherein the aperture member can be made to be an optical aperture.

Besides, preferably, a step of inserting optical barrels with the optical elements held therein into the insertion openings is provided prior to the fourth step, a light-blocking sheet is bonded to a surface on the one side of the light-blocking sheet after the insertion of the optical barrels into the insertion openings, and the light-blocking sheet is an optical sheet which defines light transmission regions, the optical sheet including light-transmitting aperture sections which are formed correspondingly to the insertion openings of the light-blocking wafer and permit transmission of light therethrough, and a light transmission restricting section which restricts transmission of light through other region than the light-transmitting aperture sections. This configuration makes it possible to provide a method of manufacturing a photoelectric conversion device accompanied by the following effects. Since the optical sheet is bonded to the one-side surface of the light-blocking wafer after the insertion of the optical barrels into the insertion openings, the optical sheet is also divided by and simultaneously with the dividing of the bonded wafer body in the fourth step. As a result, it is possible to produce bonded-body chips each having the divided optical sheet as an optical aperture. Thus, the optical aperture can be produced by the wafer level chip size packaging (WLCSP) process.

In addition, preferably, the optical element includes an optical lens, the photoelectric conversion region is a light-receiving region, and the photoelectric conversion device is an imaging device. According to this configuration, it is possible to provide a method of manufacturing a photoelectric conversion device wherein a simple structure and an excellent light-blocking property are ensured and reductions in size (tallness, thickness) and cost can be realized.

Besides, preferably, the optical element includes an optical lens, the photoelectric conversion region is a light-emitting region, and the photoelectric conversion device is a light-emitting device. This configuration makes it possible to provide a method of manufacturing a photoelectric conversion device such that a simple structure and an excellent light-blocking property are ensured and reductions in size (tallness, thickness) and cost can be made.

In the package structure for the photoelectric conversion device according to the another embodiment of the present technology, the light-blocking wafer is a wafer formed from carbon or resin. This configuration makes it possible to provide a package structure for a photoelectric conversion device wherein simplification can be achieved by providing a wafer itself with a function of holding the optical element, since the wafer itself has a light-blocking property.

Figure 11A:
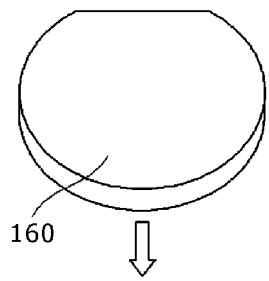
Figure 11E:
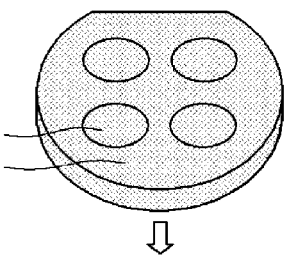

In such a related art as illustrated in FIGS. 11E to 11F, a lens wafer formed with a plurality of lenses, a transparent wafer formed from glass, and a semiconductor wafer provided with a plurality of image sensor regions each formed with a multiplicity of imaging elements, are sequentially stacked and bonded to obtain a bonded wafer body, and the bonded wafer body is diced into individual pieces (chips). On the other hand, in the method of manufacturing the photoelectric conversion device according to the one embodiment of the present technology, the light-blocking wafer which prevents transmission of light therethrough is used in place of the transparent wafer.

The light-blocking wafer is formed with aperture sections each so structured that an optical element(s) such as lens, filter, aperture (optical aperture), etc. can be inserted and held therein. Or, alternatively, the light blocking wafer is formed with aperture sections each so structured that an optical barrel can be inserted and held therein, wherein the optical barrel is so structured that an optical element(s) such as lens, filter, aperture (optical aperture), etc. can be inserted and held therein.

In the method of manufacturing the photoelectric conversion device according to the one embodiment of the present technology, the semiconductor wafer formed with a plurality of photoelectric conversion regions and the light-blocking wafer which is formed with openings so formed as to be capable of having optical elements or optical barrels inserted therein, is formed from carbon or resin, is black in color and has a light-blocking property are stacked on and adhered to each other to form the bonded wafer body. Then, before or after the optical elements or optical barrels are inserted into and fixed in the openings, the bonded wafer body is diced into individual pieces, to form bonded-body chips for constituting the photoelectric conversion devices.

In inserting and fixing the optical elements or optical barrels into the openings of the light-blocking wafer, it is desirable that the optical elements or optical barrels which are in non-defective state are inserted and fixed into the openings of the light-blocking wafer corresponding to the photoelectric conversion regions which are in non-defective state. This makes it possible to avoid wasting, to lower the yield loss, to manufacture the photoelectric device efficiently and at low cost, and to improve productivity.

Incidentally, that surface of the semiconductor wafer formed with the photoelectric conversion regions which is on the side of the photoelectric conversion regions and that surface of the light-blocking wafer which is on the opposite side to the side of insertion of the optical elements or optical barrels are stacked on each other, and are bonded to each other in such a manner that the openings and the photoelectric conversion regions face each other.

In addition, in the case where a plurality of the light-blocking wafers are used in a mutually stacked and bonded state or where a single light-blocking wafer having such a thickness that a multiplicity of optical elements can be inserted and fixed therein is used, an optical system including a multiplicity of the optical elements can be configured.

In the method of manufacturing the photoelectric conversion device according to the one embodiment of the present technology, the light-blocking wafer is provided with the function of holding the optical elements or optical barrels. This makes it possible to provide a photoelectric conversion device wherein a good light-blocking property is secured, simplification in structure and manufacturing method can be achieved, and reductions in size (tallness, thickness) and cost can be realized.

The optical element constituting the photoelectric conversion region is, for example, a light-receiving element or a light-emitting element. When the optical element is the light-receiving element, the photoelectric conversion region is a light-receiving region. When the optical element is the light-emitting element, the photoelectric conversion region is a light-emitting region.

For instance, in the case where the photoelectric conversion region is a light-receiving region and includes a solid state imaging element (light-receiving element) such as CCD (Charge Coupled Device), CMOS (Complementary Metal-Oxide Semiconductor), etc. and where a lens is used as an optical element, the photoelectric conversion device is an imaging device (camera module). In this case, a transparent base material, which has been necessary in related art so as to protect the light-receiving regions formed in the semiconductor wafer, is unnecessitated, and an inexpensive device having a good light-blocking property and being small in size (tallness, thickness) can be realized.

Besides, in the case where the photoelectric conversion region is a light-receiving region and where glass is used as the optical element, the photoelectric conversion device is a light-receiving sensor package which has a good light-blocking property.

Further, in the case where the photoelectric conversion region is a light-emitting region and includes a light-emitting element such as LED and where a lens is used as the optical element, the photoelectric conversion device is a light-emitting device, and an inexpensive device having a good light-blocking property and being small in size (tallness, thickness) can be realized.

Now, some embodiments of the present technology will be described in detail below, referring to the drawings and taking an example in which the photoelectric conversion device is an imaging device (camera module). The present technology, however, is not limited to these embodiments, insofar as it is so configured as to fulfill the above-mentioned operations and advantageous effects. Incidentally, the drawings below are so drawn as to permit easy and clear understanding of configurations, and, therefore, scale is not strictly accurate. Besides, the device components formed in each wafer are shown only in a small number.

In the following description, a black wafer formed from carbon or resin, being black in color and having a light-blocking property is used as a light-blocking wafer.

The black wafer is, for example, a carbon wafer obtained by a method in which a thermosetting resin such as phenol resin, furan resin, polycarbodiimide resin, etc. is molded into a sheet and the sheet is calcined in an inert gas atmosphere, a carbon wafer obtained by a method in which an admixture of the thermosetting resin with graphite powder is molded into a sheet and the sheet is calcined in an inert gas atmosphere, or a wafer formed from a resin colored by admixing it with a black pigment such as carbon black, titanium black, etc. The carbon wafer obtained by calcination may be subjected further to a hot isostatic pressing (HIP) treatment before use.

The above-mentioned resin is preferably an engineering plastic or a super engineering plastic, for example, polycarbonate (PC), liquid crystal polymer (LCP) or the like. An amorphous carbon wafer having a coefficient of thermal expansion of $3\times10^{-6}$, which is comparable to that of Si, is available as a commercial product (made by Chiyoda Trading Corporation); examples of the polycarbonate (PC) include those made by Teijin Limited; and examples of the liquid crystal polymer (LCP) include those made by Nippon Oil Corporation.

Besides, in the following description, a plurality of solid state imaging elements (light-receiving elements) such as CCD, CMOS, etc. are formed in an image sensor region 115. Furthermore, the plurality of image sensor regions 115 may each be provided with a microlens array (not shown).

EMBODIMENTS

<Configuration and Manufacturing Method of Camera Module>

FIGS. 1A to 1F illustrate methods of manufacturing a camera module and configurations of the camera modules, in embodiments of the present technology, wherein FIG. 1A shows perspective views for illustrating bonding between a black wafer and a semiconductor wafer, FIGS. 1B and 1C show perspective views for illustrating insertion of optical elements into insertion openings formed in a black wafer, FIG. 1D shows perspective views for each illustrating a module obtained by cutting a bonded wafer body into individual pieces, and FIGS. 1E and 1F show ZZ sectional views of the modules, with FIG. 1G being a perspective view for illustrating a camera module according to related art.

As shown in FIG. 1A, a black wafer 100 having a plurality of insertion openings 105a formed so that optical elements such as lenses 130, etc. or optical barrels described later are to be inserted and fixed therein and a semiconductor wafer 110 formed with a plurality of image sensor regions 115 are bonded (joined) to each other by use of a photo- and thermo-setting resin, for example. The bonding is conducted in such a manner that the image sensor regions 115 and the insertion openings 105a correspond to each other accurately.

The area, on the semiconductor wafer 110 side, of the insertion opening 105a is set to be greater than the area of the image sensor region 115. Therefore, the image sensor regions 115 would not be damaged at the time of bonding the black wafer 100 and the semiconductor wafer 110 to each other.

In addition, the apertures, on the upper side in FIGS. 1A to 1D, of the insertion openings 105a of the black wafer 100 may be closed with a sheet prior to the bonding between the black wafer 100 and the semiconductor wafer 110 so as to prevent contamination of the image sensor regions 115, and the sheet may be removed after the bonding. The sheet is tentatively fixed to the black wafer 100 by use of a pressure sensitive adhesive double coated tape, for example.

Next, as shown in FIG. 1B, lenses 130, for example, are inserted into the insertion openings 105a in the bonded wafer body of the black wafer 100 and the semiconductor wafer 110, and peripheral portions of the lenses 130 are bonded to inner circumferential portions of the insertion openings 105a by use of a photo- and thermo-setting region, for example. As a result, each of spaces defined by the black wafer 100 and the semiconductor wafer 110 is in the state of being isolated from the external space.

Subsequently, as shown in FIG. 1D, the bonded wafer body of the black wafer 100 and the semiconductor wafer 110 is divided in the peripheries of the image sensor regions 115 into individual pieces.

Consequently, as shown in FIG. 1E, a camera module can be obtained as a bonded-body chip in which a semiconductor chip 120 provided with the image sensor region 115 and a lens chip 135 with the lens 130 held thereon are bonded to each other.

Figure 11D:
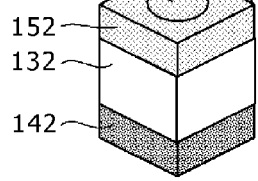

Comparison between the camera module shown in FIG. 1E and the camera module according to related art shown in FIG. 1G (the same as that shown in FIG. 11D) clearly shows that the camera module according to an embodiment of the present technology does not include the glass chip 132 and, therefore, smaller in tallness and thickness.

In FIG. 1B, the lenses 130 are inserted into the insertion openings 105a of the black wafer 100, from the upper side in FIG. 1B. However, a method may be adopted in which the black wafer 100 and the semiconductor wafer 110 are bonded to each other after inserting the lenses 130 into the insertion openings 105a of the black wafer 100 from the lower side in FIG. 1A, and, thereafter, the bonded wafer body of the black wafer 100 and the semiconductor wafer 110 is divided in the peripheries of the image sensor regions 115 into the individual pieces, as shown in FIG. 1D. In the camera module obtained in this case, the lens 130, which has been held in an upper-side space in the lens chip 135 shown in FIGS. 1E and 1F, is held in a lower-side space in the lens chip 135. Besides, for example, an IR cut filter to be described later can be held in the upper-side space in the lens chip 135.

In FIG. 1, an example is shown in which only one optical lens 130 is inserted in the insertion opening 105a of the black wafer 100. By changing the thickness of the black wafer 100, however, a configuration can also be adopted in which a plurality of optical lenses 130 are held in the insertion opening 105a. In addition, the direct insertion of the optical lens(s) 130 into the insertion opening 105a is not limitative. Specifically, a method may also be adopted in which, as described later, a plurality of optical lenses 130 are inserted and fixed in an optical barrel so structured as to be capable of holding one or plural optical lenses 130 therein, and, thereafter, the optical barrel is inserted and fixed in the insertion opening 105a. In this case, the optical lenses 130 are inserted and fixed in the optical barrel and the optical barrel is inserted and fixed in the insertion opening 105a, in such a manner that the space defined by the black wafer 100 and the semiconductor wafer 110 is put into the state of being isolated from the external space.

The camera module obtained as above is simple in structure, and can be produced inexpensively. In addition, this camera module is produced without using any cover glass for protecting the image sensor regions 115, and, therefore, can be made smaller in size (tallness, thickness) than the camera modules according to the related art. Besides, the use of the black wafer ensures that the camera module or sensor package obtained is good in light-blocking properties. Therefore, the need to provide a light-blocking member for the sole purpose of blocking light is eliminated, so that there is no need for a process of providing such a light-blocking member.

Incidentally, as shown in FIG. 1C, a configuration may also be adopted in which flat glasses 140, for example, are inserted into insertion openings 105b of a bonded wafer body of a black wafer 100a and a semiconductor wafer 110, and peripheral portions of the flat glasses 140 are bonded to inner circumferential portions of the insertion openings 105b by use of a photo- and thermo-setting region, whereby the spaces defined by the black wafer 100a and the semiconductor wafer 110 are put into the state of being isolated from the external space. In this case, the bonded wafer body of the black wafer 100a and the semiconductor wafer 110 is divided in the peripheries of the image sensor regions 115, whereby a sensor module can be obtained as a bonded-body chip in which a semiconductor chip 120 provided with the image sensor region 115 and a glass holding chip 145 with the flat glass 140 held thereon are bonded to each other, as shown in FIG. F.

<Photoirradiation Opening for Curing Photoirradiation-Type Resin>

Figure 2B:
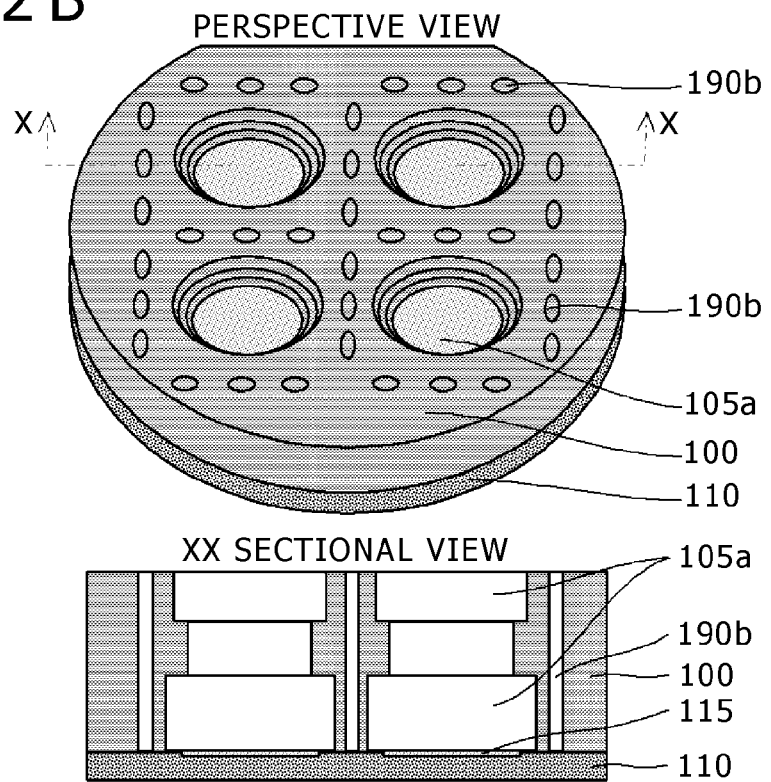

FIGS. 2A to 2B illustrate bonding between a black wafer and a semiconductor wafer by use of a photoirradiation-type resin (photo- and thermo-setting resin), in an embodiment of the present technology. Specifically, FIGS. 2A and 2B each show a perspective view and a sectional view for illustrating a bonded wafer body wherein the black wafer formed with photoirradiation openings and the semiconductor wafer are bonded to each other.

More specifically, FIG. 2A shows a perspective view and a YY sectional view illustrating a bonded wafer body wherein a black wafer 100 formed with photoirradiation openings each having an elongated rectangular shape in section and a semiconductor wafer 110 are bonded to each other. FIG. 2B shows a perspective view and an XX sectional view illustrating a bonded wafer body wherein a black wafer 100 formed with photoirradiation openings each having an elongated elliptic shape in section and a semiconductor wafer 110 are bonded to each other.

The photoirradiation openings 190a, 190b are formed to penetrate the black wafer 100 in the peripheries of image sensor regions 115, and UV radiation used for photo-curing is introduced through the photoirradiation openings 190a, 190b into a bonding area between the black wafer 100 and the semiconductor wafer 110. Therefore, a good curing environment is ensured, and a better curing effect can be obtained. Further, by heating each of the above-mentioned bonded wafer bodies, the curing is accelerated, and the bonded wafer body having the black wafer 100 and the semiconductor wafer 110 bonded to each other is formed.

The photoirradiation openings 190a, 190b may be formed additionally at the time of forming the insertion openings 105a, or may be formed by mechanical machining (or working). Further, the black wafer 100 may be formed so as to have the photoirradiation openings 190a, 190b and the insertion openings 105a, by integral molding.

By providing the black wafer 100 with the photoirradiation openings 190a, 190b, satisfactory bonding can be secured between the black wafer 100 and the semiconductor wafer 110. Further, the cutting and dividing of the bonded wafer body having the black wafer 100 and the semiconductor wafer 110 bonded to each other in the singulation (dividing into individual pieces) shown in FIG. 1D is so conducted as to proceed through the photoirradiation openings 190a, 190b, so that the time required for the cutting and dividing can be shortened as compared with the case where the photoirradiation openings 190a, 190b are not formed.

Incidentally, in the case where optical elements such as lenses have not been inserted in the insertion openings 105a or where the optical elements such as lenses have been inserted in the insertion openings 105a but the optical elements are formed from a material that transmits UV radiation therethrough, the UV radiation is introduced through the insertion openings 105a into the bonding area between the black wafer 100 and the semiconductor wafer 110, so that curing is made to proceed. Therefore, the photoirradiation openings 190a, 190b may thereafter be formed, and, further, UV rays may be introduced into the bonding area between the black wafer 100 and the semiconductor wafer 110 through the photoirradiation openings 190a, 190b.

<Alignment Between Black Wafer and Semiconductor Wafer>

FIGS. 3A to 3C illustrate an example of alignment between the black wafer 100 and the semiconductor wafer 110 in an embodiment of the present technology, wherein FIG. 3A shows a plan view and a VV sectional view for illustrating the black wafer, FIG. 3B shows a plan view and a WW sectional view for illustrating the semiconductor wafer, and FIG. 3C shows a VV (WW) sectional view for illustrating the condition where the black wafer and the semiconductor wafer have been bonded to each other.

As shown in FIG. 3A, the black wafer 100 is formed with projections 192 at its surface for bonding to the semiconductor wafer 110, in addition to the insertion openings 105a. On the other hand, as shown in FIG. 3B, the semiconductor wafer 110 is formed with recesses 194 in its surface on the side on which the image sensor regions 115 are formed. The projections 192 and the recesses 194 are so formed as to ensure the following: in the case where the black wafer 100 and the semiconductor wafer 110 are stacked on each other so that rectilinear portions of the black wafer 100 and the semiconductor wafer 110 are aligned with each other and that the center positions of the projections 192 and those of the recesses 194 coincide with each other, the center positions of the insertion openings 105a and those of the image sensor regions 115 correspond to each other and fitting between the projections 192 and the recesses 194 is achieved, as shown in FIG. 3C.

Incidentally, FIGS. 3A to 3C show one example of alignment between the black wafer 100 and the semiconductor wafer 110, but this is not limitative. Naturally, any method for alignment may be used insofar as the center positions of the insertion openings 105a and those of the image sensor regions 115 can be made to correspond accurately to each other by the method.

<Formation of Optical Aperture>

Figure 4A:
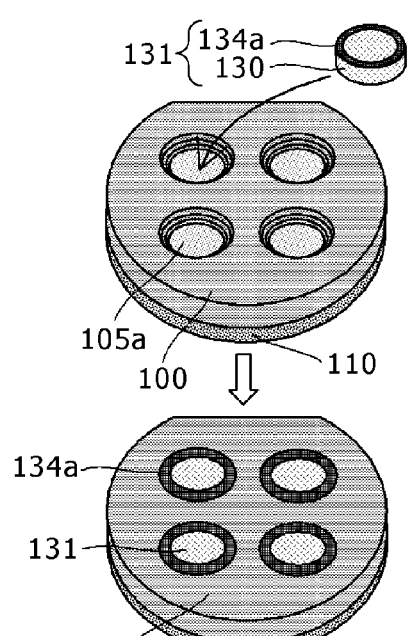
FIGS. 4A to 4F illustrate methods of forming an aperture of a camera module, in embodiments of the present technology.
Figure 4B:
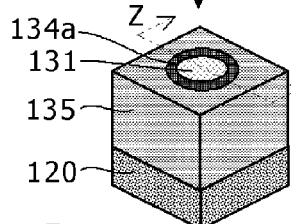
Figure 4E:
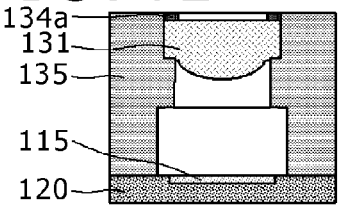
Figure 4C:
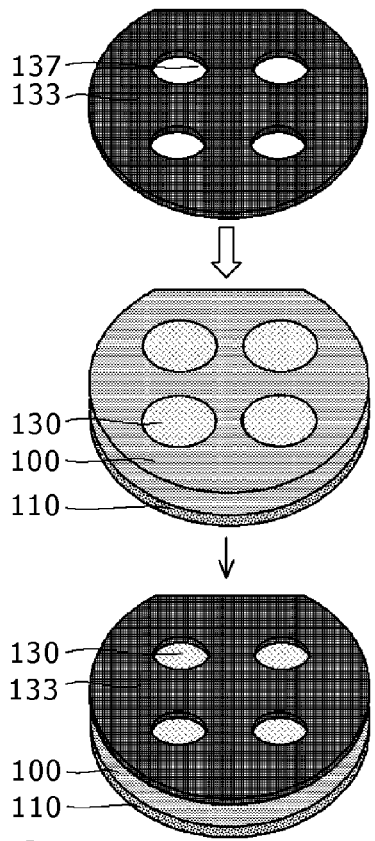
Figure 4D:
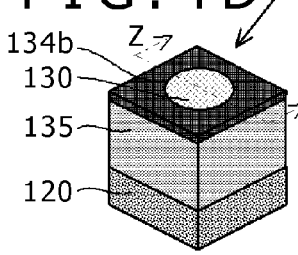
Figure 4F:
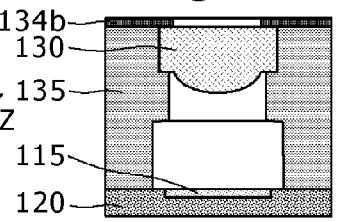

FIGS. 4A to 4F illustrate methods of forming an aperture (optical aperture) of a camera module, in embodiments of the present technology, wherein FIGS. 4A and 4B show perspective views for illustrating an example in which an apertured lens (a lens provided with an aperture) is used, FIGS. 4C and 4D show perspective views for illustrating an example in which an aperture sheet is used, and FIGS. 4E and 4F show ZZ sectional views of the camera modules.

As shown in FIG. 4A, an apertured lens 131 having an aperture-defining body 134a formed in the vicinity of the outer circumference of a lens 130 is inserted into each of insertion openings 105a of a bonded wafer body having a black wafer 100 and a semiconductor wafer 110 bonded to each other. Next, as shown in FIG. 4B, the bonded wafer body is divided into individual pieces, whereby bonded body-chips each having a sectional structure shown in FIG. 4E can be obtained. The aperture-defining body 134a can be formed by printing with a coating material which contains a black material, or by vapor deposition of a black material.

As shown in FIG. 4C, a black aperture sheet 133 which has apertures 137 formed correspondingly to the insertion openings 105a is stacked on and bonded to the bonded wafer body having the black wafer 100 and the semiconductor wafer 110 bonded to each other (with the lenses 130 being inserted in the insertion openings 105a). Next, as shown in FIG. 4D, the bonded wafer body with the aperture sheet 133 bonded thereto is cut into individual pieces, whereby bonded-body chips each having a sectional structure shown in FIG. 4F and provided with an aperture-defining body 134b can be obtained.

Incidentally, in FIG. 4A, a method may also be adopted wherein the lenses 130 are inserted and fixed in the insertion openings 105a, and thereafter an aperture-defining body which is formed separately from the lens 130 and defines an aperture for permitting incidence of light therethrough is disposed on the lens 130 inserted in the insertion opening 105a.

<Wafer Reinforcement Plate>

FIGS. 5A to 5C illustrate bonding between a black wafer and a semiconductor wafer by use of a wafer reinforcement plate(s), in an embodiment of the present technology, wherein FIG. 5A shows perspective views for illustrating holding of strength by bonding between the black wafer and the reinforcement plate, FIG. 5B shows perspective views for illustrating holding of strength by bonding between the semiconductor wafer and the reinforcement plate, and FIG. 5C is a perspective view for illustrating bonding between the black wafer and the semiconductor wafer for both of which the wafer reinforcement plates are respectively used.

In stacking a black wafer 100 formed with insertion openings 105a and a semiconductor wafer 110 formed with image sensor regions 115 on each other and bonding the wafers to each other, if the black wafer and/or the semiconductor wafer 110 is small in thickness, the black wafer 100 and/or the semiconductor wafer 110 may be warped. In such a case, a wafer reinforcement plate(s) is bonded to the black wafer and/or the semiconductor wafer by a tentative-fixation adhesive. After the black wafer 100 and the semiconductor wafer 110 are bonded to each other, the wafer reinforcement plate(s) is peeled from the black wafer 100 and/or the semiconductor wafer 110.

FIGS. 5A to 5C illustrate an example in which both the black wafer 100 and the semiconductor wafer 110 are reinforced respectively with the wafer reinforcement plates and thereafter the black wafer 100 and the semiconductor wafer 110 are stacked on and bonded to each other, wherein FIG. 5A illustrates an example in which a wafer reinforcement plate 196a is bonded to the black wafer 100 to reinforce the latter, and FIG. 5B shows an example in which a wafer reinforcement plate 196b is bonded to the semiconductor wafer 110 to reinforce the latter.

The wafer reinforcement plate 196a bonded to the black wafer 100 as shown in FIG. 5A is desirably formed from a transparent material (e.g., glass material) which has substantially the same thermal characteristics as those of the black wafer 100 and which permits transmission therethrough of UV radiation for curing a photo- and thermo-setting resin used to bond the black wafer 100 and the semiconductor wafer 110 to each other. In addition, the wafer reinforcement plate 196b bonded to the semiconductor wafer 110 as shown in FIG. 5B is desirably formed from a material (e.g., glass material) which has substantially the same thermal characteristics as those of the semiconductor wafer 110.

After the black wafer 100 and the semiconductor wafer 110 are bonded to each other as shown in FIG. 5C, the wafer reinforcement plates are peeled off. Therefore, the wafer reinforcement plates can be used repeatedly, so that the use of them would not lead to a rise in cost.

The tentative-fixation adhesive used here may be any one that can be removed by cleaning (washing). For example, a hot-melt adhesive which contains natural or synthetic shellac or an alkali-soluble adhesive which contains an acrylic resin, an epoxy resin or the like as a main constituent can be used. After the black wafer 100 and the semiconductor wafer 110 are bonded to each other, the tentative-fixation adhesive can be released by heating or by immersion in an alkaline solution.

<Black Wafer Stack>

Figure 6:
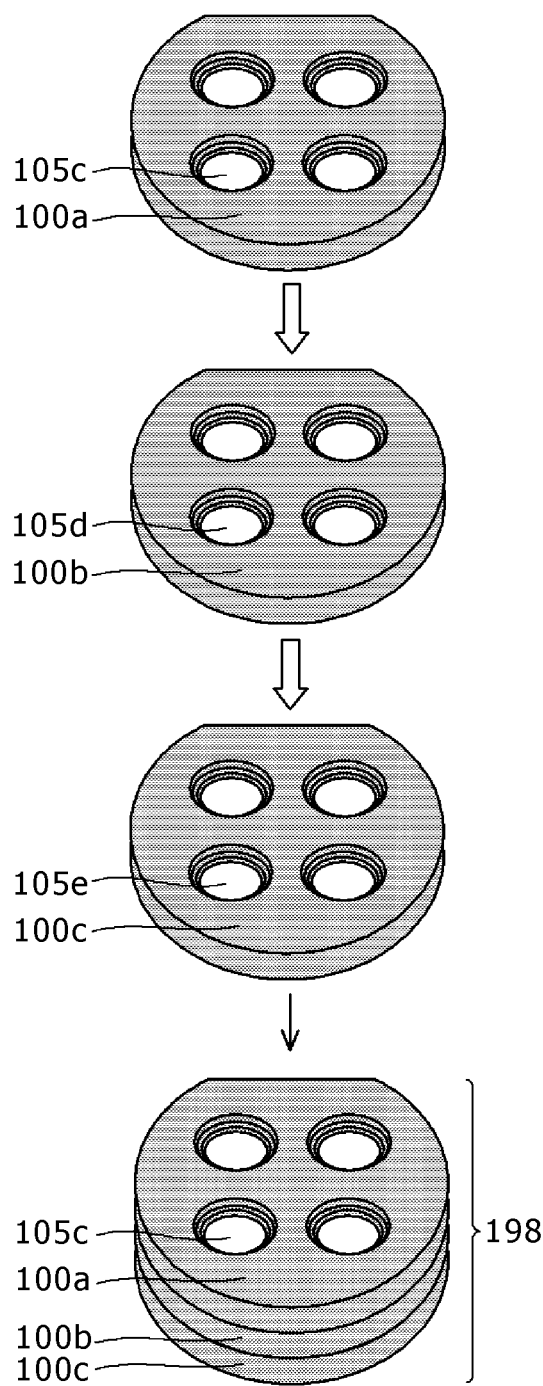
FIG. 6 illustrates a stack obtained by bonding a plurality of black wafers, in an embodiment of the present technology.

FIG. 6 shows perspective views for illustrating a black wafer stack obtained by bonding a plurality of black wafers to one another, in an embodiment of the present technology.

By using a plurality of black wafers, it is possible to configure optical systems each having a multiplicity of lenses. FIG. 6 illustrates an example of a stack obtained by bonding three black wafers. As shown in FIG. 6, the black wafers 100a, 100b and 100c are formed respectively with insertion openings 105c, 105d and 105e, and they are stacked on and bonded to one another in the order of the black wafers 100a, 100b and 100c, to form a bonded body. Then, a semiconductor wafer formed with image sensor regions is bonded to the black wafer 100c of the bonded body.

Prior to the formation of the bonded body of the black wafers 100a, 100b and 100c, optical element such as lenses are inserted and fixed into the inside of at least the insertion openings 105d of the black wafer 100b from the upper side or/and the lower side of the insertion openings 105d, and, if necessary, optical elements such as lenses may be inserted and fixed into the insertion openings 105c and 105e of the black wafers 100a and 100c.

Prior to bonding between the bonded body of the black wafers 100a, 100b and 100c and a semiconductor wafer, optical elements such as lenses can be inserted and fixed into the bonded body of the black wafers 100a, 100b and 100c, respectively from the upper side of the insertion openings 105c and from the lower side of the insertion openings 105e.

After the semiconductor wafer is bonded to the bonded body of the black wafers 100a, 100b and 100c wherein the optical elements such as lenses have been inserted and fixed respectively in the inside of the insertion openings 105c, 105d and 105e in the above-mentioned manner, singulation (division into individual pieces) is performed, as shown in FIG. 1D.

<Wafer Alignment in Forming Black Wafer Stack>

FIGS. 7A to 7C illustrate wafer alignment in forming a black wafer stack by bonding a plurality of black wafers to one another, in an embodiment of the present technology.

In the case of stacking a plurality of black wafers on one another and bonding them to one another as shown in FIG. 6, alignment between the black wafers stacked on each other may be needed to ensure that the center optical axes of the optical elements such as lenses inserted and fixed in the insertion openings of the black wafers will be coaxial.

FIGS. 7A to 7C illustrate alignment in forming a stack by bonding two black wafers to each other. As shown in FIG. 7A, the black wafer (upper wafer) 100d which is stacked on the upper side and formed with insertion openings 105f is provided with a projection 182 at a lower surface thereof. On the other hand, as shown in FIG. 7B, the black wafer (lower wafer) 100e which is stacked on the lower side and formed with insertion openings 105g is provided with a recess 184 in an upper surface thereof.

The projection 182 and the recess 184 are for ensuring that the center optical axes of the optical elements such as lenses inserted and fixed respectively in the insertion openings 105f, 105g will be coaxial (or common) upon bonding of the black wafers 100d and 100e to each other. As shown in FIG. 7C, the fitting between the projection 182 and the recess 184 effects alignment between the black wafers 100d and 100e.

<Fixation of Lens Barrel to Black Wafer>

FIGS. 8A to 8H illustrate fixation of lens barrels to a black wafer in an embodiment of the present technology, wherein FIGS. 8A to 8E show perspective views and SS sectional views for illustrating fixation of the lens barrels to the black wafer by screws, and FIGS. 8F to 8H show SS sectional views for illustrating insertion and adhesive fixation of the lens barrels into the black wafer, with FIG. 8I illustrating an example of fixation of a lens barrel in a camera module according to related art.

An optical barrel with an optical element(s) such as lens, filter, aperture (optical aperture), etc. held and contained therein can also be contained and held in each of the openings formed in the black wafer. Since a representative example of the optical elements are lenses, the optical barrel will be referred to as lens barrel, in the following description. In the example illustrated in FIGS. 8A to 8H, the black wafer serves as a support for a lens barrel.

As shown in FIG. 8A, a black wafer 100f formed with insertion openings 105h and a semiconductor wafer 110 formed with an image sensor regions 115 are stacked on and bonded to each other, to form a bonded wafer body. A lens barrel 200a as shown in FIG. 8B is inserted into each of the insertion openings 105a of the bonded wafer body. In FIG. 8B, there are shown an example of the lens barrel 200a in which no lens is contained and an example of the lens barrel 200a in which a lens 130 is contained.

As shown in FIG. 8A, the insertion opening 105h is provided at its inner peripheral surface with a female screw as a screw engagement section 201. On the other hand, as shown in FIG. 8B, the lens barrel 200a is provided at its outer peripheral surface with a male screw as a screw engagement section 201.

As shown in FIG. 8D and FIG. 8E of FIG. 8C of FIG. 8A, the lens barrels 200a are put into screw engagement with and inserted in the insertion openings 105h. After the lens barrels 200a are screw-engaged with and inserted in the insertion openings 105h, an adhesive (locking agent) may be made to penetrate between each pair of the female screw and the male screw in screw engagement so as to prevent movement of each lens barrel 200a at the screw engagement area 201. If there is a need to adjust the distance between the lens 130 and the image sensor region 115, it may suffice to regulate the screw engagement distance (or insertion distance) in putting the lens barrel 200a into screw engagement with the insertion opening 105h.

In an example shown in FIGS. 8A to 8E, the height of the lens barrels 200a is greater than the thickness of the black wafer 100f, but this is not limitative. For example, as shown in FIGS. 8F to 8H, a black wafer 100g having a thickness substantially equal to the height of lens barrels 200b and formed with insertion openings 105i and a semiconductor wafer 110 formed with image sensor regions 115 may be stacked on and bonded to each other to form a bonded wafer body, and the lens barrels 200b may be inserted into and fixed by adhesion to the insertion openings 105i of the bonded wafer body; or, the lens barrels 200b may be put into screw engagement with the insertion openings 105i by use of screws, like in the example shown in FIG. 8A.

In the examples shown respectively in FIG. 8A to FIG. 8H, description has been made of examples in which the lens barrels are inserted and fixed in the insertion openings of the bonded wafer body having the black wafer and the semiconductor wafer stacked on and bonded to each other. However, the insertion and fixation of the lens barrel into the insertion opening may be carried out after dividing the bonded wafer body into individual pieces.

FIG. 8I illustrates an example of fixation of a lens barrel in a camera module according to related art. In this example, a lens holder 202 serving as a support for a lens barrel 200c is bonded to a glass chip 132 which is bonded to a semiconductor chip 142 for a protective purpose. Under conditions where the height of the lens barrel and the thickness of the semiconductor wafer (chip) are the same, the camera modules in the examples shown in FIGS. 8A to FIG. 8H can be made smaller in tallness (thickness) than the camera module in the related-art example shown in FIG. 8I, at least by a value corresponding to the thickness of the glass chip 132.

Like the black wafer, the lens barrels shown in FIGS. 8A to FIG. 8H are formed from a material which is black in color and has a light-blocking property, such as carbon or a resin. For example, the lens barrels can be formed by molding from a resin colored by addition of a black pigment such as carbon black, titanium black, etc.

<Configuration Example of Lens Barrel>

Figure 9A:
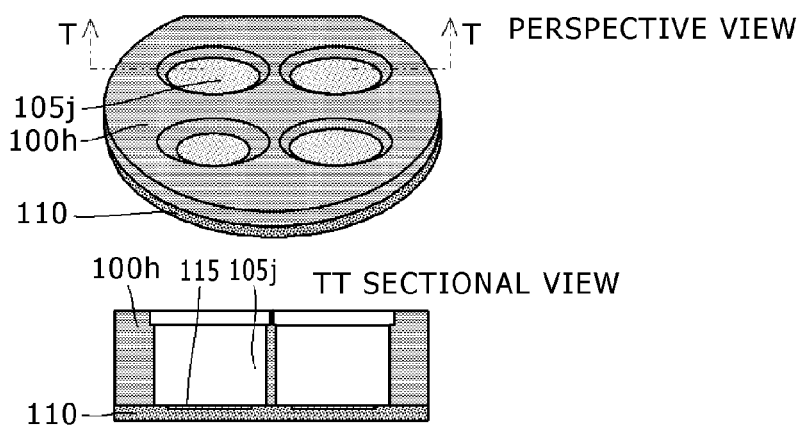
FIGS. 9A to 9C illustrate configuration examples of lens barrel, in embodiments of the present technology.
Figure 9B:
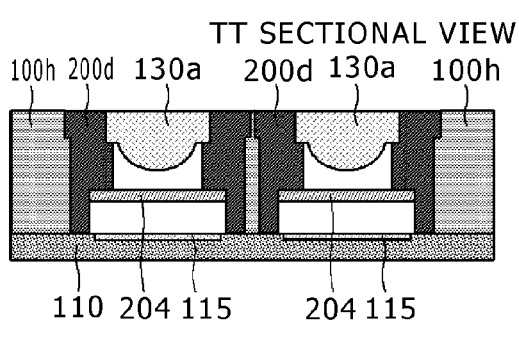
Figure 9C:
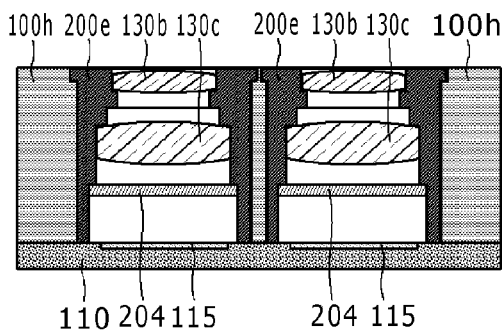
Figure 10:
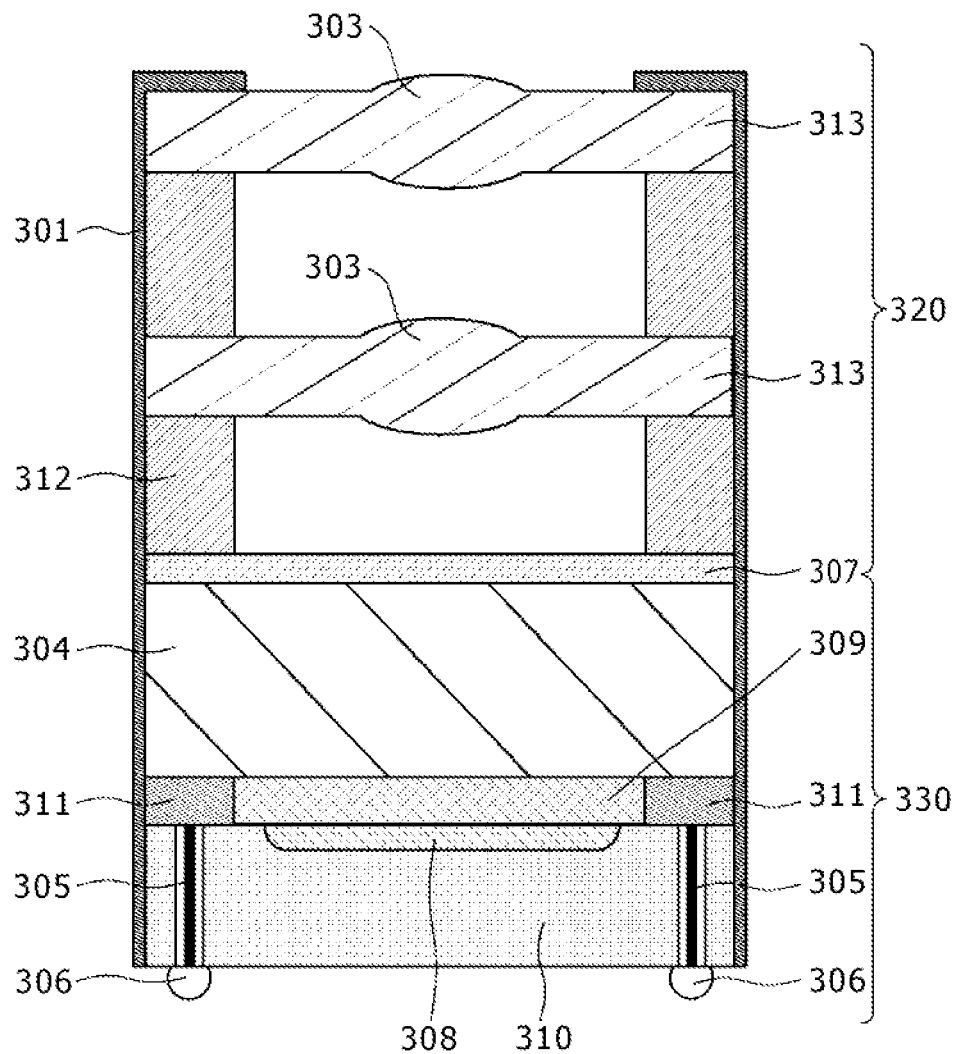
FIG. 10 is a sectional view showing the structure of a camera module according to related art.

FIGS. 9A to 9C illustrate configuration examples of lens barrel in embodiments of the present technology, wherein FIG. 9A shows a perspective view and a TT sectional view for illustrating a stack (bonded wafer body) having a black wafer and a semiconductor wafer stacked on and bonded to each other, and FIGS. 9B and 9C show TT sectional views of stacks (bonded wafer bodies) each having lens barrels inserted therein.

In FIGS. 8A to 8I, examples of lens barrel have been shown in which one lens is contained as an optical element, but this is not limitative.

FIGS. 9A to 9C illustrate examples of lens barrel (optical barrel) in which one or plural lenses and an optical filter are contained.

FIG. 9A illustrates a bonded wafer body wherein a black wafer 100h formed with insertion openings 105j and a semiconductor wafer 110 formed with image sensor regions 115 are stacked on and bonded to each other. Lens barrels are inserted into and fixed and contained in the insertion openings 105*j*, and the black wafer 100*h* serves as a support for the lens barrels. As has been described referring to FIGS. 8A to 8H, the lens barrels are fixed and held in the insertion openings 105*j*, by screw engagement or by adhesion.

In FIG. 9B, there is shown an example in which lens barrels 200*d* each having an IR cut filter 204 and a lens 130*a* contained in the inside thereof are inserted into and fixed and contained in the insertion openings 105*j*. The IR cut filter 204 is inserted through a lower-side aperture of the lens barrel 200*d*, whereas the lens 130*a* is inserted via an upper-side aperture of the lens barrel 200*d*. The respective whole peripheral portions of the IR cut filter 204 and the lens 130*a* are fixed to an inner periphery of the lens barrel 200*d* with an adhesive.

In FIG. 9C, there is illustrated an example in which lens barrels 200*e* each having an IR cut filter 204 and lenses 130*b* and 130*c* contained therein are inserted into and fixed and contained in the insertion openings 105*j*. The lens 130*c* and the IR cut filter 204 are inserted through a lower-side aperture of the lens barrel 200*e*, whereas the lens 130*b* is inserted via an upper-side aperture of the lens barrel 200*e*. The respective whole peripheral portions of the IR cut filter 204 and the lenses 130*b* and 130*c* are fixed to an inner periphery of the lens barrel 200*e* with an adhesive.

Incidentally, in FIGS. 8A, through 9C, optical elements such as lenses are inserted and fixed in the lens barrels and the lens barrels are inserted and fixed in the insertion openings of the black wafer, in such a manner that the spaces defined by the black wafer and the semiconductor wafer are put in the state of being isolated from the external space.

While some embodiments of the present technology have been described above, the present technology is not limited to the above embodiments, and, naturally, various modifications are possible based on the technical thought of the present technology.

According to embodiments of the present technology, it is possible to provide a photoelectric conversion device, a package structure therefor, and a method of manufacturing a photoelectric conversion device wherein a simple structure and an excellent light-blocking property are ensured and reductions in size (tallness, thickness) and cost can be realized.

The present disclosure contains subject matter related to that disclosed in Japanese Priority Patent Application JP 2010-146028 filed in the Japan Patent Office on Jun. 28, 2010, the entire content of which is hereby incorporated by reference.

What is claimed is:

1. A method of manufacturing a photoelectric conversion device, comprising:
    a first step of forming a plurality of photoelectric conversion regions on a surface on one side of a semiconductor wafer;
    a second step of preparing a light-blocking wafer having insertion openings, the insertion openings corresponding respectively to the photoelectric conversion regions, wherein the light-blocking wafer is a wafer formed from carbon or resin;
    a third step of bonding the one-side surface of the semiconductor wafer and a surface on the opposite side to a surface on the one side of the light-blocking wafer to each other, in such a manner that the photoelectric conversion regions and the insertion openings correspond to each other, to form a bonded wafer body without an optical element;
    a step of inserting an optical element into the insertion openings of the bonded wafer body; and
    a step of bonding a reinforcement plate to a surface on the opposite side to the one-side surface of the semiconductor wafer or/and to the one-side surface of the light-blocking wafer, prior to the third step,
    a fourth step of dividing the bonded wafer body in peripheries of the photoelectric conversion regions, to obtain bonded-body chips each having the photoelectric conversion region.

2. The method of manufacturing the photoelectric conversion device according to claim 1, wherein the light-blocking wafer is a wafer obtained by stacking and bonding a plurality of unit wafers each formed with the insertion openings and formed from carbon or resin, and the method comprises a step of inserting the optical element into the insertion opening prior to the third step.

3. The method of manufacturing the photoelectric conversion device according to claim 1, wherein that part of the light-blocking wafer at which the bonded wafer body is divided in the fourth step and which is adjacent to the insertion opening of the light-blocking wafer is formed, in the second step, with a hole penetrating the light-blocking wafer.

4. The method of manufacturing the photoelectric conversion device according to claim 1, wherein alignment between the semiconductor wafer and the light-blocking wafer is performed in the third step so that the photoelectric conversion regions of the semiconductor wafer and the insertion openings of the light-blocking wafer correspond to each other.

5. The method of manufacturing the photoelectric conversion device according to claim 1, wherein the one-side surface of the semiconductor wafer and the opposite-side surface of the light-blocking wafer are formed respectively with fitting sections for fitting between the semiconductor wafer and the light-blocking wafer, and the semiconductor wafer and the light-blocking wafer are fitted to each other in the third step.

6. The method of manufacturing the photoelectric conversion device according to claim 1, wherein prior to the step of inserting the optical elements, the optical elements are each provided with an aperture member which includes a light-transmitting aperture section permitting transmission of light therethrough and a light transmission restricting section restricting transmission of light through other region than the light-transmitting aperture section.

7. The method of manufacturing the photoelectric conversion device according to claim 1, further comprising a step of inserting the optical element into the insertion opening prior to the fourth step, wherein
    a light-blocking sheet is bonded to a surface on the one side of the light-blocking wafer after the insertion of the optical elements into the insertion openings, and the light-blocking sheet is an optical sheet which defines light transmission regions, the optical sheet including light-transmitting aperture sections which are formed correspondingly to the insertion openings of the light-blocking wafer and permitting transmission of light therethrough, and a light transmission restricting section which restricts transmission of light through other region than the light-transmitting aperture sections.

8. The method of manufacturing the photoelectric conversion device according to claim 1, further comprising a step of inserting optical barrels each having the optical element held thereon into the insertion openings, before or after the fourth step.

9. The method of manufacturing the photoelectric conversion device according to claim 8, wherein prior to the step of inserting the optical barrels into the insertion openings, the optical elements held in the optical barrels are each provided with an aperture member including a light-transmitting aperture section which permits transmission of light therethrough, and a light transmission restricting section which restricts transmission of light through other region than the light-transmitting aperture section.

10. The method of manufacturing the photoelectric conversion device according to claim 1, further comprising a step of inserting optical barrels with the optical elements held therein into the insertion openings prior to the fourth step, wherein
- a light-blocking sheet is bonded to a surface on the one side of the light-blocking sheet after the insertion of the optical barrels into the insertion openings, and
- the light-blocking sheet is an optical sheet which defines light transmission regions, the optical sheet including light-transmitting aperture sections which are formed correspondingly to the insertion openings of the light-blocking wafer and permitting transmission of light therethrough, and a light transmission restricting section which restricts transmission of light through other region than the light-transmitting aperture sections.

11. The method of manufacturing the photoelectric conversion device according to claim 1, wherein the optical element includes an optical lens, the photoelectric conversion region is a light-receiving region, and the photoelectric conversion device is an imaging device.

12. The method of manufacturing the photoelectric conversion device according to claim 1, wherein the optical element includes an optical lens, the photoelectric conversion region is a light-emitting region, and the photoelectric conversion device is a light-emitting device.

13. A package structure for a photoelectric conversion device, wherein in regard to a semiconductor wafer having a plurality of photoelectric conversion regions formed on a surface on one side thereof and a light-blocking wafer having insertion openings, wherein the insertion openings correspond respectively to the photoelectric conversion regions, wherein the light-blocking wafer is a wafer formed from carbon or resin and the one-side surface of the semiconductor wafer and a surface on the opposite side to the one side of the light-blocking wafer are bonded to each other to form a bonded wafer body without an optical element, wherein a reinforcement plate is bonded to a surface on the opposite side to the one-side surface of the semiconductor wafer and/or to the one-side surface of the light-blocking wafer, wherein an optical element is inserted into at least one insertion opening of the bonded wafer body, wherein the bonded wafer body is divided in peripheries of the photoelectric conversion regions to form bonded-body chips each having the photoelectric conversion region, and wherein the photoelectric conversion regions and the insertion openings correspond to each other.

14. A photoelectric conversion device comprising:
- a package structure for the photoelectric conversion device, wherein in regard to a semiconductor wafer having a plurality of photoelectric conversion regions formed on a surface on one side thereof and a light-blocking wafer having insertion openings, wherein the insertion openings correspond respectively to the photoelectric conversion regions, wherein the light-blocking wafer is a wafer formed from carbon or resin and the one-side surface of the semiconductor wafer and a surface on the opposite side to the one side of the light-blocking wafer are bonded to each other to form a bonded wafer body without an optical element, wherein a reinforcement plate is bonded to a surface on the opposite side to the one-side surface of the semiconductor wafer and/or to the one-side surface of the light-blocking wafer, wherein an optical element is inserted into at least one insertion opening of the bonded wafer body, wherein the bonded wafer body is divided in peripheries of the photoelectric conversion regions to form bonded-body chips each having the photoelectric conversion region, and wherein the photoelectric conversion regions and the insertion openings correspond to each other.

15. The method of manufacturing the photoelectric conversion device according to claim 1, further comprising curing a bonding material used to bond the light-blocking wafer and the semiconductor wafer by introducing Ultraviolet (UV) light into photoirradiation openings of the light-blocking wafer.

\* \* \* \* \*